United States Patent
Jang et al.

(10) Patent No.: US 11,795,572 B2
(45) Date of Patent: Oct. 24, 2023

(54) METHOD OF MANUFACTURING A SILICON CARBIDE INGOT COMPRISING MOVING A HEATER SURROUNDING A REACTOR TO INDUCE SILICON CARBIDE RAW MATERIALS TO SUBLIMATE AND GROWING THE SILICON CARBIDE INGOT ON A SEED CRYSTAL

(71) Applicant: SENIC INC., Cheonan-si (KR)

(72) Inventors: Byung Kyu Jang, Suwon-si (KR); Jong Hwi Park, Suwon-si (KR); Eun Su Yang, Suwon-si (KR); Jung Woo Choi, Suwon-si (KR); Sang Ki Ko, Suwon-si (KR); Kap-Ryeol Ku, Suwon-si (KR); Jung-Gyu Kim, Suwon-si (KR)

(73) Assignee: SENIC INC., Cheonan-si (KR)

( * ) Notice: Subject to any disclaimer, the term of this patent is extended or adjusted under 35 U.S.C. 154(b) by 0 days.

(21) Appl. No.: 17/329,460

(22) Filed: May 25, 2021

(65) Prior Publication Data
US 2021/0372003 A1    Dec. 2, 2021

(30) Foreign Application Priority Data
May 29, 2020 (KR) .................... 10-2020-0064719

(51) Int. Cl.
*C30B 23/06* (2006.01)
*C30B 23/00* (2006.01)
*C30B 29/36* (2006.01)

(52) U.S. Cl.
CPC ............ *C30B 23/06* (2013.01); *C30B 23/002* (2013.01); *C30B 29/36* (2013.01)

(58) Field of Classification Search
CPC ....... C30B 23/00; C30B 23/002; C30B 23/02; C30B 23/06; C30B 23/063; C30B 23/066;
(Continued)

(56) References Cited

U.S. PATENT DOCUMENTS 6,800,136 B2 * 10/2004 Snyder .................... C30B 23/06
117/106
9,856,583 B2 * 1/2018 Harada ................... C30B 29/36
(Continued)

FOREIGN PATENT DOCUMENTS

CN    106906515 A    *  6/2017
CN    106906515 A       6/2017
(Continued)

OTHER PUBLICATIONS

Klein, Olaf, et al.. "Transient numerical investigation of induction heating during sublimation growth of silicon carbide single crystals." *Journal of Crystal Growth* vol. 247, Issues 1-2, Jan. 2003, (3 pages in English).
(Continued)

*Primary Examiner* — Kenneth A Bratland, Jr.
(74) *Attorney, Agent, or Firm* — NSIP Law (57) ABSTRACT

A method of manufacturing a silicon carbide ingot, includes a preparing operation of adjusting internal space of a reactor in which silicon carbide raw materials and a seed crystal are disposed to have a high vacuum atmosphere, a proceeding operation of injecting an inert gas into the internal space, heating the internal space by moving a heater surrounding the reactor to induce the silicon carbide raw materials to sublimate, and growing the silicon carbide ingot on the seed crystal, and a cooling operation of cooling the temperature of the internal space to room temperature. The moving of the heater has a relative position which becomes more distant at a rate of 0.1 mm/hr to 0.48 mm/hr based on the seed crystal.

4 Claims, 4 Drawing Sheets

(58) Field of Classification Search
CPC ......... C30B 29/00; C30B 29/10; C30B 29/36; C23C 14/06; C23C 14/0658
USPC ............... 117/84, 88–89, 102, 105, 937, 951
See application file for complete search history.

(56) References Cited

U.S. PATENT DOCUMENTS

| | | | |
|---|---|---|---|
| 2013/0280466 | A1 | 10/2013 | Zwieback et al. |
| 2014/0220298 | A1 | 8/2014 | Loboda |
| 2015/0275393 | A1 | 10/2015 | Bondokov et al. |
| 2016/0138185 | A1 | 5/2016 | Hori et al. |
| 2017/0137962 | A1* | 5/2017 | Ma .................... C30B 23/025 |

FOREIGN PATENT DOCUMENTS

| | | |
|---|---|---|
| JP | 2003-504298 A | 2/2003 |
| JP | 2009-280431 A | 12/2009 |
| JP | 2010-111521 A | 5/2010 |
| JP | 2014-201498 A | 10/2014 |
| JP | 2014-201508 A | 10/2014 |
| JP | 2015-224169 A | 12/2015 |
| JP | 2018-140884 A | 9/2018 |
| JP | 6489891 B2 | 3/2019 |
| KR | 10-2006-0040733 A | 5/2006 |
| KR | 10-2006-0095268 A | 8/2006 |
| KR | 10-2009-0109325 A | 10/2009 |
| KR | 10-1003075 B1 | 12/2010 |
| KR | 10-2011-0071092 A | 6/2011 |
| KR | 10-2012-0130030 A | 11/2012 |
| KR | 10-2013-0013710 A | 2/2013 |
| KR | 10-2013-0124023 A | 11/2013 |
| KR | 10-2015-0116885 A | 10/2015 |
| KR | 10-1619610 B1 | 5/2016 |
| KR | 10-2017-0072441 A | 6/2017 |
| KR | 10-1760030 B1 | 8/2017 |
| KR | 10-2017-0135218 A | 12/2017 |
| KR | 10-2068933 B1 | 1/2020 |

OTHER PUBLICATIONS

Chinese Office Action dated Aug. 26, 2023, in counterpart Chinese Patent Application No. 202011099174.X (12 pages in Chinese).

* cited by examiner

METHOD OF MANUFACTURING A SILICON CARBIDE INGOT COMPRISING MOVING A HEATER SURROUNDING A REACTOR TO INDUCE SILICON CARBIDE RAW MATERIALS TO SUBLIMATE AND GROWING THE SILICON CARBIDE INGOT ON A SEED CRYSTAL

CROSS-REFERENCE TO RELATED APPLICATIONS

This application claims the benefit under 35 USC 119(a) of Korean Patent Application No. 10-2020-0064719, filed on May 29, 2020, in the Korean Intellectual Property Office, the entire disclosure of which is incorporated herein by reference for all purposes.

BACKGROUND

1. Field

The present disclosure relates to a method of manufacturing a silicon carbide ingot and a system for manufacturing a silicon carbide ingot.

2. Description of Related Art

Silicon carbide (SiC) has excellent heat resistance and mechanical strength, and is physically and chemically stable, so that it is attracting attention as a semiconductor material. Recently, as a substrate for high-power devices, the demand for silicon carbide single crystal substrates is increasing.

As a method for preparing a SiC single crystal, there are Liquid Phase Epitaxy (LPE), Chemical Vapor Deposition (CVD), Physical Vapor Transport (PVT), and the like. PVT is a method of growing a SiC single crystal by loading SiC raw materials into a crucible, disposing a seed crystal composed of a SiC single crystal on the top of the crucible, and then heating the crucible by an induction heating method to sublimate the raw materials to grow the SiC single crystal on the seed crystal.

PVT is the most widely used for the preparation of SiC in the form of an ingot because it has a high growth rate. However, the temperature distribution inside a crucible may change depending on the temperature gradient condition during induction heating of the crucible, the relative position of a heater, the temperature difference between the top of the crucible and the bottom of the crucible, etc., thereby affecting the quality of the manufactured silicon carbide ingot.

Accordingly, to improve the silicon carbide ingot's crystal quality and guarantee the ingot's reproducibility, it may be desirable to sufficiently consider factors that may affect the temperature distribution inside the crucible during the ingot growing procedure.

The above-described background technology is technical information acquired by the inventor for the derivation of an embodiment or acquired during the derivation process and is not necessarily a prior art disclosed to the general public before filing the present disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of manufacturing a silicon carbide ingot, includes a preparing operation of adjusting internal space of a reactor in which silicon carbide raw materials and a seed crystal are disposed to have a high vacuum atmosphere, a proceeding operation of injecting an inert gas into the internal space, heating the internal space by moving a heater surrounding the reactor to induce the silicon carbide raw materials to sublimate, and growing the silicon carbide ingot on the seed crystal, and a cooling operation of cooling the temperature of the internal space to room temperature. The moving of the heater has a relative position which becomes more distant at a rate of 0.1 mm/hr to 0.48 mm/hr based on the seed crystal.

The proceeding operation may sequentially include a pre-growth process and a growth process. The pre-growth process may sequentially include a first process, a second process, and a third process. The first process may change the high vacuum atmosphere to an inert atmosphere, the second process may raise the temperature of the internal space using the heater, and the third process may depressurize the internal space to reach growth pressure and heat the internal space to growth temperature. The growth process may maintain the internal space at the growth temperature and the growth pressure and induce the ingot to grow. The heater may be moved during the growth process.

A maximum heating region of the internal space may correspond to a position at a center of the heater, and the maximum heating region may have a temperature of 2100° C. to 2500° C.

The internal space may have a sub-heating region with a temperature 110° C. to 160° C. lower than the temperature of the maximum heating region, and the heater may be movable to maintain the temperature of the sub-heating region.

A temperature difference between an upper portion of the internal space and a lower portion of the internal space in the first process may be 40° C. to 60° C.

A total moving distance of the heater may be 10 mm or more.

A temperature difference between the upper portion of the internal space and the lower portion of the internal space in the growth process may be greater than the temperature difference in the first process by 70 to 120° C.

In another general aspect, a silicon carbide ingot includes a front region and a rear region opposite to the front region. The rear region has a cut surface cut from a seed crystal of the silicon carbide ingot. A difference between a height from a center of the front region and a height from an edge of the front region is 0.01 mm to 3 mm based on the rear region, and a maximum height in the vertical direction from the rear region is 15 mm or more. The silicon carbide ingot has a micropipe density of $1/cm^2$ or less, a basal surface dislocation density of $1300/cm^2$ or less, and an etch pit density of $12000/cm^2$ or less.

In another general aspect, a system for manufacturing a silicon carbide ingot includes a reactor having an internal space, a heat insulating material disposed on an outer surface of the reactor and surrounding the reactor, a heater, and a mover. The heater is configured to adjust a temperature of the reactor or the internal space. A silicon carbide seed crystal is disposed at an upper portion of the internal space, and raw materials are disposed at a lower portion of the internal space. The mover is configured to change a relative position of the heater, based on the reactor to an up-and-down direction, to be more distant at a rate of 0.1 mm/hr to 0.48 mm/hr based on the silicon carbide seed crystal. The silicon carbide ingot is grown from the silicon carbide seed crystal.

A maximum heating region of the internal space may be at a position corresponding to a center of the heater, and has a temperature of 2100° C. to 250° C. The internal space may have a sub-heating region with a temperature of 110° C. to 160° C. lower than the temperature of the maximum heating region. The heater may be further configured to move to maintain the temperature of the sub-heating region.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

In the present specification, the term "combination of" included in Markush type description means mixture or combination of one or more elements described in Markush type and thereby means that the disclosure includes one or more elements selected from the Markush group.

While the inventors consider a plan to minimize the occurrence of defects and cracks in the silicon carbide ingot and improve the silicon carbide ingot crystal quality, the inventors invented a method of manufacturing a silicon carbide ingot in which the relative position of the reactor and the heater is changed at a predetermined speed in the growth operation of the silicon carbide ingot. Hereinafter, the example embodiments will be described in more detail.

Method of Manufacturing a Silicon Carbide Ingot

In one general aspect, a method of manufacturing a silicon carbide ingot, comprises a preparing operation of disposing silicon carbide raw materials 300 and a seed crystal 110 in the internal space of a reactor 200 and adjusting the internal space to a high vacuum atmosphere (Sa); a proceeding operation of injecting an inert gas into the internal space, heating the internal space through a heater 600 surrounding the reactor, inducing the silicon carbide raw materials to be sublimated, and growing a silicon carbide ingot 100 on the seed crystal (Sb, S1); and a cooling operation of cooling the temperature of the internal space to room temperature (S2). The proceeding operation comprises a procedure in which the heater is moved, and the moving of the heater may have a relative position which becomes more distant at a rate of 0.1 mm/hr to 0.48 mm/hr based on the seed crystal.

The heater 600 and the reactor 200 may be installed to have a relative position changeable to up-and-down direction. The relative position may be changed through the mover, and it may be changed when one or more of the heater and the reactor are moved. Changing the relative position through the movement of a heater may be advantageous, not through a reactor's movement, for further stable growth of a silicon carbide ingot.

Figure 1:
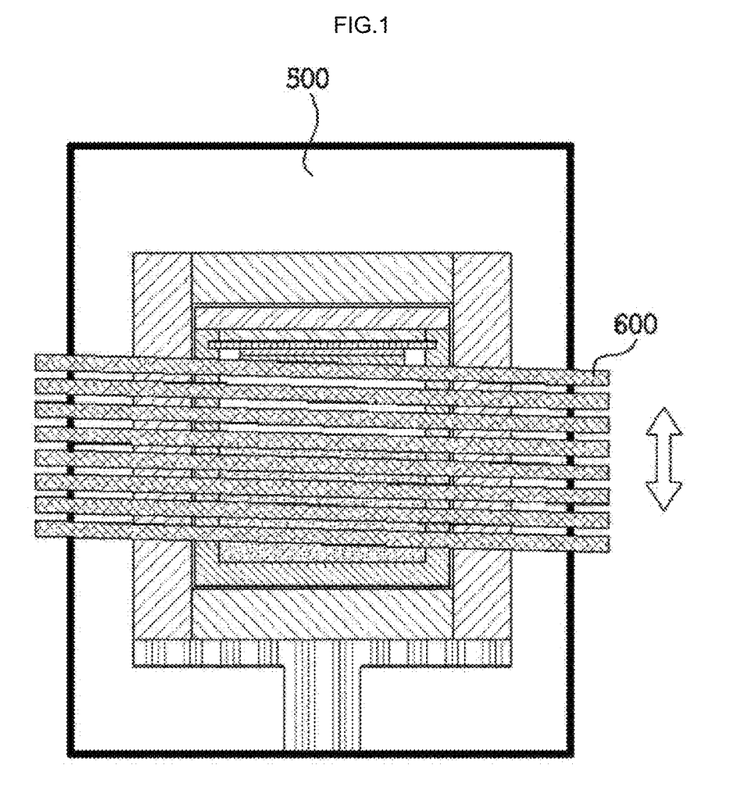
FIG. 1 is a conceptual view showing an example of an apparatus for manufacture to which a method of manufacturing a silicon carbide ingot is applied according to one or more examples.
Figure 2:
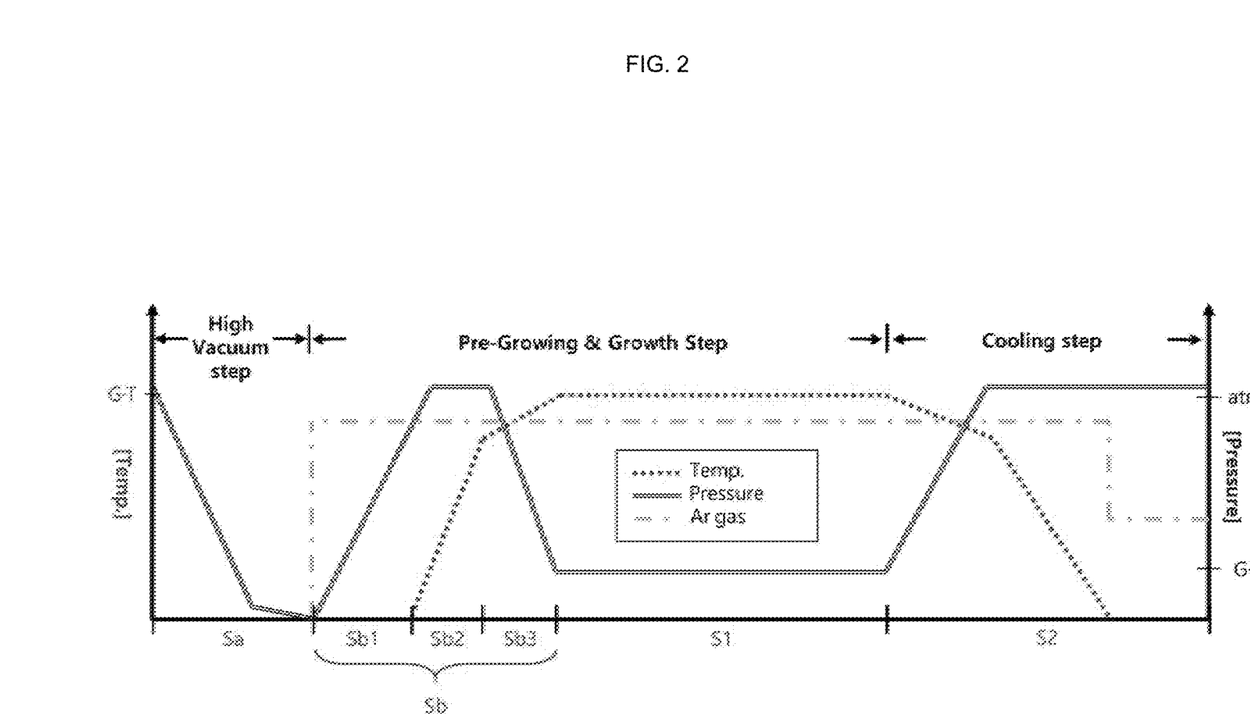
FIG. 2 is a graph showing trends of temperature versus time, pressure, and argon gas pressure, in a method of manufacturing a silicon carbide ingot according to one or more examples.
Figure 3:
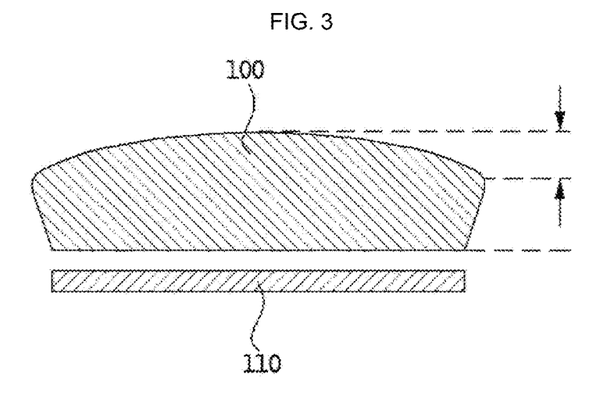
FIG. 3 is a conceptual view showing an ingot manufactured by a method of manufacturing a silicon carbide ingot according to one or more examples, and a difference in the height of the front region of the ingot.
Figure 4:
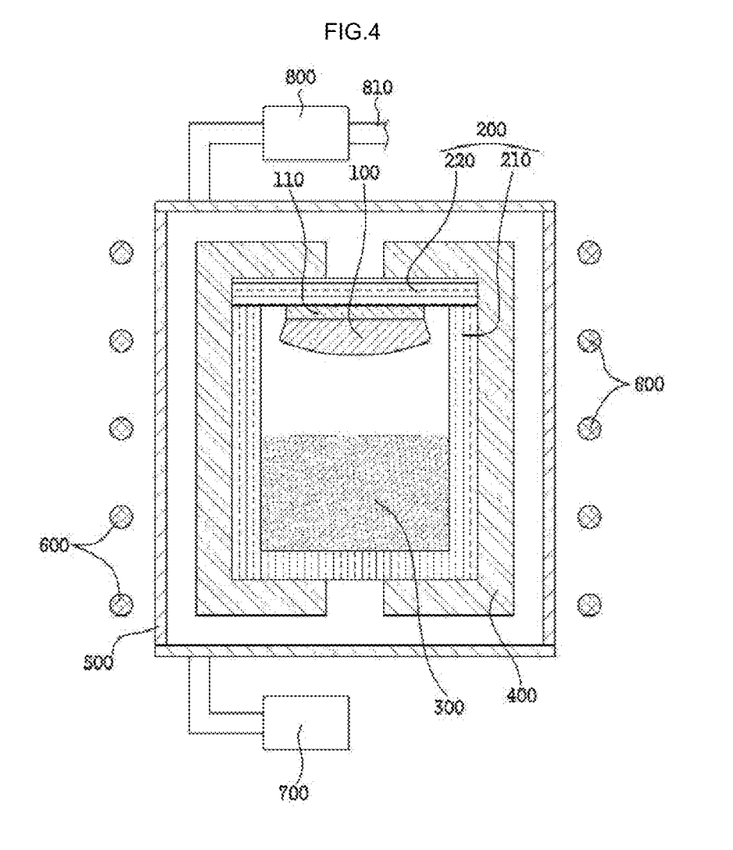
FIG. 4 is a conceptual view showing an example of an apparatus for manufacturing a silicon carbide ingot according to one or more examples.
Figure 5:
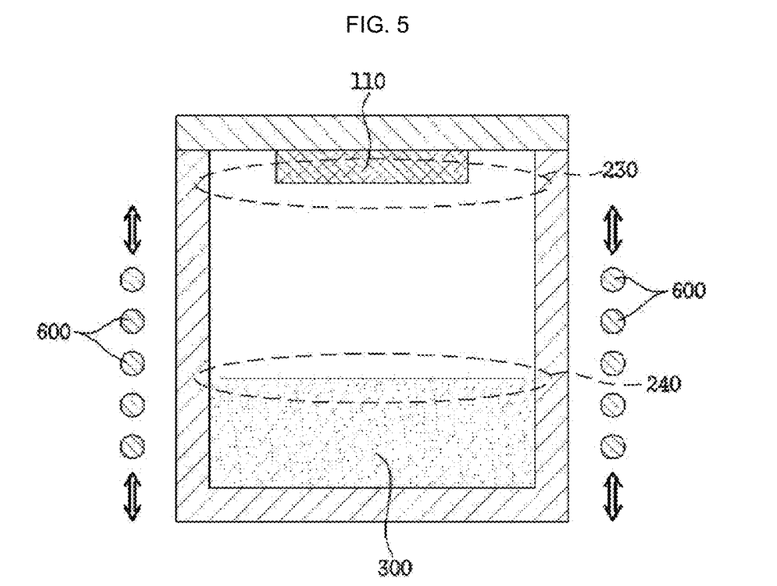
FIG. 5 is a conceptual view showing an apparatus for manufacturing a silicon carbide ingot according to one or more examples.

FIGS. 1, 4, and 5 show an example of an apparatus for manufacturing a silicon carbide ingot. Referring to this, a method of manufacturing a silicon carbide ingot according to example embodiments will be described.

The preparing operation (Sa) is a operation of disposing the raw materials 300 and the silicon carbide seed crystals 110 to face each other in a reactor having an internal space and adjusting the internal space to have a high vacuum atmosphere.

In the preparing operation (Sa), the internal space pressure may be reduced to be 50 torr or less, 10 torr or less, or 5 torr or less, and the pressure may be reduced to be 1 torr or more. When going through the preparing operation (Sa) having such a high vacuum atmosphere, it is possible to manufacture an ingot with more reduced defects.

The silicon carbide seed crystal in the preparing operation (Sa) may be applied appropriately based on the size of a target ingot. As an example, a silicon carbide wafer may be applied. The C plane (000-1 plane) of the silicon carbide seed crystal may be directed toward the raw materials 300.

The silicon carbide seed crystal in the preparing operation (Sa) may comprise 4 inches or more of 4H silicon carbide, or 6 inches or more of 4H silicon carbide.

When the silicon carbide seed crystal 110 has a form attached to the seed crystal holder (not shown in drawings), the silicon carbide seed crystal may further comprise an adhesive layer disposed on the rear region. When the silicon carbide seed crystal has a form not directly adhered to the seed crystal holder, the silicon carbide seed crystal may further comprise a protective layer disposed on the rear region. In this case, it is possible to induce the growth of a silicon carbide ingot with more reduced defects.

The silicon carbide raw materials 300 in the preparing operation (Sa) may be raw materials in the form of a powder having a carbon source and a silicon source. The raw materials may comprise silicon carbide powder.

The silicon carbide raw materials 300 may comprise a silicon carbide powder necked from each other or a silicon carbide powder in which the surface is carbonized. In this case, it is possible to help further grow a more efficient silicon carbide by inducing a more stable sublimation of silicon carbide during the growth process and the like.

The reactor 200 in the preparing operation (Sa) may be applied if it is a vessel suitable for a silicon carbide ingot's growth reaction. Specifically, a graphite crucible may be applied. For example, the reactor may comprise a body 210 comprising an internal space and an opening, and a cover 220 corresponding to the opening, thereby sealing the internal space. The cover may further comprise a seed crystal holder integrally or separately from the cover. The seed crystal holder may fix the silicon carbide seed crystal so that the silicon carbide seed crystal 110 and the silicon carbide raw materials 300 face each other.

The reactor 200 in the preparing operation (Sa) may further comprise a heat-insulating material 400 disposed in the outer surface surrounding the reactor. At this time, the heat insulating material may contact the reactor or have a predetermined interval. In the reaction chamber 500, such as a quartz tube, the heat insulating material surrounding the reactor may be positioned. The temperature of the internal space of the reactor 200 may be controlled by the heater 600 external of the heat insulating material and the reaction chamber.

The heat-insulating material 400 in the preparing operation (Sa) may have an air porosity of 72% to 95%, 75% to 93%, or 80% to 91%. When the heat insulating material satisfying the above air porosity is applied, crack generation of the grown silicon carbide ingot may be further reduced.

The heat-insulating material 400 in the preparing operation (Sa) may have a compressive strength of 0.2 Mpa or more. The heat-insulating material 400 may have a compressive strength of 0.48 Mpa or more, or 0.8 MPa or more. In addition, the heat insulating material may have a compressive strength of 3 MPa or less, or 2.5 MPa or less. When the heat insulating material has such a compressive strength, it may have excellent thermal/mechanical stability, and the probability of occurrence of ash is lowered so that a silicon carbide ingot with better quality may be manufactured.

The heat-insulating material 400 in the preparing operation (Sa) may comprise a carbon-based felt, may specifically comprise graphite felt, and may comprise rayon-based graphite felt, or pitch-based graphite felt.

The reaction chamber 500 may comprise a vacuum exhauster 700 connected to the inside of the reaction chamber to adjust the degree of vacuum inside the reaction chamber, a plumbing 810 connected to the inside of the reaction chamber to introduce gas the inside of the reaction chamber, and a mass flow controller 800 to control the inflow of gas. Through the operations described, the inert gas's flow rate in a subsequent growth operation and a cooling operation may be controlled.

In the proceeding operation (Sb, S1), inert gas is injected into the internal space, and the raw materials are sublimated by adjusting the temperature, pressure, and atmosphere of the internal space, thereby inducing the growth of the silicon carbide ingot 100 from the silicon carbide seed crystal 110.

The proceeding operation (Sb, S1) may substantially change the internal space to have an inert gas atmosphere. The inert gas atmosphere may be formed by decompressing the reactor's internal space, which has an atmospheric atmosphere, thereby substantially inducing the atmosphere to vacuum atmosphere, after the process of disposing the silicon carbide raw materials 300 and seed crystals 110, and then injecting an inert gas. But it is not necessarily limited to this method.

In the proceeding operation (Sb, S1), the inert gas atmosphere refers to the atmosphere of the internal space in the growth operation not being an atmospheric atmosphere but based on an inert gas atmosphere. However, the inert gas atmosphere also comprises an atmosphere in which a trace amount of gas is injected to dope a silicon carbide ingot. An inert gas is applied to the inert gas atmosphere, and for example, the inert gas may be argon, helium, or a mixture thereof.

The proceeding operation (Sb, S1) may proceed while heating the reactor 200 or the reactor's internal space through the heater 600, and simultaneously or individually with the heating, may proceed while decompressing the internal space to adjust the degree of vacuum and injecting an inert gas.

The proceeding operation (Sb, S1) comprises a process of sublimating the silicon carbide raw materials 300 and a process of inducing a silicon carbide ingot 100 to grow on one surface of the silicon carbide seed crystal 110.

The heater 600 may be disposed around the reactor 200. It may be installed to be movable in the up-and-down direction substantially parallel to an arbitrary line from the silicon carbide seed crystal 110 to the raw material 300. The heater may comprise a mover for changing a relative position in the up-and-down direction between the heater and the reactor. Accordingly, the relative position between the reactor and the heater may be changed, and a temperature gradient in the internal space can be induced. The heater may make a temperature difference between an upper portion of the internal space and a lower portion of the internal space.

The heater 600 may be an induction heater formed in a spiral coil along the outer peripheral surface of the reactor 200 or the outer peripheral surface of the heat insulating material 400 surrounding the reactor, but is not limited to this.

The proceeding operation (Sb, S1) sequentially may comprise a pre-growth process (Sb) and a growth process (S1), wherein the pre-growth process sequentially may comprise a first process, a second process, and a third process. The first process (Sb1) is changing the high-vacuum atmosphere in the preparing operation to an inert atmosphere. The second process (Sb2) is raising the temperature of the internal space using the heater. The third process (Sb3) is depressurizing the pressure of the internal space to reach the growth pressure by heating the internal space to have the growth temperature.

The growth process (S1) maintains the internal space at the growth temperature and the growth pressure and induces the ingot to grow.

The first process (Sb1) may be performed by injecting an inert gas such as argon. In this case, the pressure of the internal space may be 500 torr to 800 torr.

The second process (Sb2) is to heat the lower portion 240 of the internal space to have a starting temperature of 1500° C. to 1700° C. before growth. The temperature increase in the second process (Sb2) may proceed at a rate of 1° C./min to 10° C./min.

In the third process (Sb3), the temperature may be increased so that the lower portion of the internal space's temperature becomes the growth temperature 2100° C. to 2500° C., and the growth pressure may be reduced to 1 torr to 50 torr. The temperature increase in the third process (Sb3) may proceed at a rate of 1° C./min to 5° C./min.

The second process and the third process can prevent the occurrence of polymorphism other than the target crystal in the above range of temperature increase rate and pressure. And the second process and the third process can induce stable growth of the ingot.

Referring to FIG. 5, the upper portion 230 of the internal space is a partial space of the internal space close to the surface of the silicon carbide seed crystal 110 or the ingot, and the lower portion of the internal space 240 is a space of the internal space close to the surface of the raw materials 300. Specifically, the temperature of an upper portion 230 of the internal space is measured in a position located at a distance about 5 mm or more below the surface of the silicon carbide seed crystal or the ingot. More specifically, the temperature of an upper portion of the internal space is the temperature measured at about 5 mm below the surface of the silicon carbide seed crystal or the ingot. The temperature of a lower portion 240 of the internal space is measured in a position located at a distance about 10 mm or more above the raw materials 300. More specifically, the temperature of a lower portion of the internal space is measured at about 10 mm above the raw materials. Suppose the measured temperature is different for each measured position when the upper portion of the internal space and the lower portion of the internal space is the same position seen in a length direction of a crucible. In that case, the temperature measurement is based on the temperature of the center.

In the growth process (S1), the heater's relative position may be moved based on the reactor.

In the growth process (S1), the meaning of maintaining the growth pressure comprises a case where the pressure of the injected gas is somewhat adjusted as needed within a range in which the growth of the silicon carbide ingot does not stop under reduced pressure. Also, the meaning of maintaining the growth pressure is that the pressure in the internal space is maintained within a predetermined range within a limit capable of maintaining the growth of the silicon carbide ingot.

In the pre-growth process (Sb), a predetermined temperature difference may be generated between the temperature at the upper portion 230 of the internal space and the lower portion of the internal space. The temperature difference at the starting temperature before growth may be 40° C. to 60° C., or 50° C. to 55° C. The temperature difference at the growth temperature may be 110° C. to 160° C., or 135° C. to 150° C. By having this temperature difference, the pre-growth process can minimize the occurrence of polymorphism other than the target crystal and induce stable growth of the ingot.

The heating rate of the third process (Sb) may be less than the average heating rate of the entire second process (Sb2) and third process (Sb3). The average heating rate of the entire second process (Sb2) and third process (Sb3) is a value obtained by dividing the difference between the temperature at the start of the second process and the temperature at the end of the third process by the time taken. The third process's heating rate refers to the heating rate at each point in the third process.

The heater 600 may have a maximum heating region. The maximum heating region refers to a portion having the highest temperature in the atmosphere of the internal space heated by the heater. When the heater surrounds the side surface of the reactor in the form of a spiral coil, the internal space corresponding to the center of the heater is the maximum heating region. For example, when assuming a line (the vertical center line) in the vertical direction connecting the center of the seed crystal 110 and the silicon carbide raw materials 300, and a surface (the central surface of heater) extended in the horizontal direction from the center of the height of the heater, the maximum heating region may be a region in which an intersection point between the vertical center line and the horizontal surface of the heater is located.

The second process (Sb) and the third process (Sc) may be performed by adjusting the maximum heating region of the heater to become the lower portion of the reactor and the surface of the raw materials 300, and when the heater has a spiral coil shape, a temperature difference between the upper portion of the internal space and the lower portion of the internal space may be generated by changing the number of winding and thickness of heater.

The growth process (S1) is a process of sublimating the raw materials to form a silicon carbide ingot, after the internal space is heated to the growth temperature in the third process (5b3). In this case, the growth process may maintain the growth temperature of the internal space to form a silicon carbide ingot. Maintaining the growth temperature does not refer to that it must be performed at a fixed proceeding temperature during the growth process, and It refers to that a silicon carbide is grown in a temperature range where the growth of the silicon carbide ingot practically does not stop, even if there is a slight change in the absolute temperature.

The relative position of the heater 600 with respect to the reactor in the growth process (S1) may become more distant at a rate of 0.1 mm/hr to 0.48 mm/hr based on the seed crystal 110. The relative position may become more distant at a rate of 0.1 mm/hr to 0.4 mm/hr or at a rate of 0.2 mm/hr to 0.3 mm/hr based on the seed crystal 110. The speed range is quite low. If the relative position is changed at this speed, the growth process can prevent the occurrence of polymorphic crystals other than the target crystal and grow a silicon carbide ingot with reduced defects.

In the growth process (S1), the change of the relative position of the heater 600 with respect to the reactor 200 and the seed crystal 110 may be performed after reaching the growth temperature, and may be performed after 1 hour to 10 hours after reaching the growth temperature.

In the growth process (S1), the upper portion 230 of the internal space may have a sub-heating region where the temperature is 110° C. to 160° C. lower than the temperature of the maximum heating region in the reactor. Also, the temperature of the sub-heating region may be 135° C. to 150° C. lower than the temperature of the maximum heating region.

The sub-heating region refers to a region having a relatively low temperature in the atmosphere of the internal space heated by the heater. When the heater surrounds the side surface of the reactor in the form of a spiral coil, the sub-heating region may be located above the maximum heating region when assuming a line in the vertical direction connecting (the vertical center line) the center of the seed crystal 110 and the silicon carbide raw materials 300, and a surface (the central surface of heater) extended in the horizontal direction from the center of the height of the heater, the sub-heating region may be located between the maximum heating region and the silicon carbide seed crystal or ingot surface. Also, at least some of the sub-heating region may overlap the upper portion of the internal space.

The heater 600 can be moved up-and-down direction based on the reactor 200 through a mover for changing a relative position between the heater and the reactor 200 to the up-and-down direction. It is possible to move in a substantially parallel direction based on an arbitrary line from the seed crystal 110 disposed in the reactor toward the silicon carbide raw materials 300.

The heater 600 in the growth process (S1) may be moved while descending relative to the reactor at the above speed.

The growth temperature in the growth process (S1) may be 2100° C. to 2500° C., or 2200° C. to 2400° C. based on the maximum heating region. Also, the growth temperature in the growth process (S1) may be 1900° C. to 2300° C. or 2100° C. to 2250° C. based on the upper portion 230 of the internal space.

During the growth process (S1), the total moving distance of the heater may be 10 mm or more, or 15 mm or more. Also, during the growth process (S1), the total moving distance of the heater may be 45 mm or less, or 30 mm or less.

The growth process may proceed for 5 hours to 200 hours. Also, the growth process may proceed for 75 hours to 100 hours.

The pre-growth process (Sb) and/or the growth process (S1) may be performed while the reactor 200 rotates in the vertical direction. Through this, a temperature gradient that is more favorable for growth of a silicon carbide ingot may be induced to be formed.

In the proceeding operation (Sb, S1), an inert gas of a predetermined flow rate may be added to the outside of the reactor 200. The inert gas may form a flow of gas in the internal space of the reactor 200 and may induce a flow of gas from the raw materials 300 toward the silicon carbide seed crystal 110. Through this, a stable temperature gradient of the reactor and the internal space can be formed.

The cooling operation (S2) is a operation of cooling the silicon carbide ingot grown through the proceeding operation under conditions of a predetermined cooling rate and flow rate of an inert gas.

In the cooling operation (S2), cooling may proceed at a rate of 1° C. to 10° C. Also, cooling may proceed at a rate of 1° C. to 5° C.

In the cooling operation (S2), pressure control of the internal space of the reactor 200 may proceed simultaneously or separately. The pressure may be controlled to have a pressure in the internal space of 800 torr at maximum.

In the cooling operation (S2), like the proceeding operation, an inert gas of a predetermined flow rate may be added to the inside of the reactor 200. The inert gas may form a flow of gas in the internal space of the reactor 200. Also, the inert gas may form a flow of gas from the raw materials 300 toward the silicon carbide seed crystal 110.

The cooling operation may comprise a first cooling process and a second cooling process. The first cooling process is a process of pressurizing the pressure of the internal space of the reactor 200 to be at least atmospheric pressure, and cooling the temperature of the internal space to be 1500° C. to 1700° C. based on the upper portion 230 of the internal space. The second cooling process is a process of cooling the temperature of the internal space to room temperature after the first cooling operation.

The recovery in the cooling operation may be achieved by cutting the rear region of the silicon carbide ingot in contact with the seed crystal 110. The silicon carbide ingot cut in this way shows a favorable height difference between the center of the grown end and the edge, and can have a reduced defect density.

The specific shape and defect density of the silicon carbide ingot will be described below.

System for Manufacturing Silicon Carbide Ingot

In one general aspect, a system for manufacturing silicon carbide ingot, comprise a reactor 200 having an internal space; a heat insulating material 400 disposed on the outer surface of the reactor and surrounding the reactor; and a heater 600 of adjusting the temperature of the reactor or the internal space. A silicon carbide seed crystal 110 may be located at an upper portion of the internal space and raw materials 300 may be located at a lower portion of the internal space. The system may comprise a mover changing the relative position of the heater based on the reactor to the up-and-down direction, and may grow a silicon carbide ingot on the seed crystal, wherein the moving of the heater becomes more distant at a rate of 0.1 mm/hr to 0.48 mm/hr based on the seed crystal.

The silicon carbide ingot 100 may have a difference between a height from the center of the front region and a height from the edge of the front region of 0.01 mm to 3 mm, and may have a maximum height in the vertical direction from the rear region of 15 mm or more, based on the rear region separated from the silicon carbide ingot 110.

The silicon carbide ingot 100 may have a micropipe density of $1/cm^2$ or less, may have a basal surface dislocation density of $1300/cm^2$ or less, and may have an etch pit density of $12000/cm^2$ or less.

Referring to FIG. 4, the reactor 200 may comprise a body 210 comprising an internal space and an opening, and a cover 220 corresponding to the opening and sealing the internal space. Others are the same as described above.

The material and physical properties of the insulating material 400 are the same as described above.

The system for manufacturing a silicon carbide ingot may comprise a reaction chamber 500 in which a reactor 200 surrounded by the insulating material 400 is placed therein. In this case, the heater 600 may be provided outside the reaction chamber to control the temperature of the internal space of the reactor.

The reaction chamber 500 may comprise a vacuum exhauster 700, a pipe 810, and a mass flow controller 800. The vacuum exhauster 700 is a device connected to the inside of the reaction chamber and controlling the degree of vacuum inside the reaction chamber, a pipe 810 is a device connected to the inside of the reaction chamber and introducing gas into the reaction chamber, and a mass flow controller 800 is a device that controls the gas inflow. Through these, it may be possible to control the flow rate of the inert gas in the growth operation and the cooling operation.

Referring to FIG. 5, the relative position of the heater 600 with respect to the reactor 200 may become more distant at a rate of 0.1 mm/hr to 0.48 mm/hr, may be distant at a rate of 0.1 mm/hr to 0.4 mm/hr, or may be distant at a rate of 0.2 mm/hr to 0.3 mm/hr based on the seed crystal. By satisfying the above moving speed, a stable temperature difference and temperature gradient can be applied, even if an ingot grows and the position of the surface changes and the formation of polymorphic crystals other than the target crystal is prevented.

The movement of the heater 600 may proceed in the proceeding operation of sublimating the raw materials by controlling the temperature, pressure, and atmosphere of the internal space, and preparing a silicon carbide ingot grown from the seed crystal. For example, it may proceed in the second and third processes, which are the pre-growth process of the proceeding operation and the growth process. These operations and processes are the same as described above.

The systems may comprise a mover changing the relative position of the heater 600 based on the reactor 200 to up-and-down direction, and in the growing operation, the heater may descend and move at the above speed as shown in FIG. 1.

The heater 600 can make the maximum heating region to be located at a lower portion of the internal space. The maximum heating region is a region of the internal space at a position corresponding to the center of the heater. When the heater has a spiral coil shape, the internal region of the heater having a predetermined length toward both ends from the center of the heater, based on an arbitrary line connecting the silicon carbide raw materials and the seed crystal 110 may be the maximum heating region. The temperature of the maximum heating region may be 2100° C. to 2500° C., or 2200° C. to 2400° C.

The heater 600 may be moved so that the temperature of the upper portion of the internal space is 110° C. to 160° C. lower than, or 135° C. to 150° C. lower than the temperature of the maximum heating region in the growth process. When the heater has a spiral coil shape, the upper portion of the internal space may be located above the center, which is the maximum heating region. The temperature of the upper portion of the internal space may be 1900° C. to 2300° C., or 2100° C. to 2250° C.

The system for manufacturing the silicon carbide ingot may sequentially proceed in the preparing operation (Sa), the proceeding operation (Sb, S1), and the cooling operation (S2) described above.

Silicon Carbide Ingot

In one general aspect, a silicon carbide ingot 100, according to example embodiments, has a difference of 0.01 mm to 3 mm, or 0.01 mm to 2.9 mm between a height from the center of the front region, which is the opposite side based on the rear region cut from the silicon carbide seed crystal 100, and a height from the edge of the front region.

The silicon carbide ingot 100 may have a maximum height of 15 mm or more, 18 mm or more, or 21.6 mm or more in the vertical direction from the rear region.

The silicon carbide ingot may have a micropipe density of $1/cm^2$ or less, $0.8/cm^2$ or less, or $0.59/cm^2$ or less.

The silicon carbide ingot may have a basal surface dislocation density of $1300/cm^2$ or less, 1100/cm2 or less, or $980/cm^2$ or less.

The silicon carbide ingot may have an etch pit density of $12000/cm^2$ or less, or of $10000/cm^2$ or less.

The micropipe density, basal surface dislocation density, and etch pit density can be calculated by cutting the silicon carbide ingot 100 to prepare a wafer, immersing the wafer in molten potassium hydroxide (KOH) under conditions of 500° C. and 5 minutes, and etching the wafer, and then measuring the defects per unit area in the surface through an optical microscope, etc.

When the silicon carbide ingot 100 satisfies the above defect density range, a wafer with few defects can be provided. When applied to a device, a device with excellent electrical or optical properties can be manufactured.

Manufacture of Silicon Carbide Ingot

As shown examples of an apparatus for manufacturing a SiC ingot in FIG. 4 and FIG. 5, a silicon carbide ingot powder as a raw material 300 was disposed at the lower portion 240 of internal space of the reactor 200, and a silicon carbide seed crystal was disposed at the upper portion of internal space. At this time, the silicon carbide seed crystal was made of 4H—SiC crystal having a diameter of 6 inch, and the C plane (000-1 plane) was fixed by an ordinary manner to face the SiC raw material in the lower portion of internal space.

After a reactor 200 was sealed and the outside thereof was surrounded by a heat insulating material 400, the reactor was disposed in a quartz tube 500 equipped with a heating coil in the outside, which is a heater 600.

As shown in FIG. 1, the internal space of the reactor 200 was depressurized to be adjusted to a vacuum atmosphere, and was injected with argon gas to reach 760 torr, wherein the temperature of the internal space was raised to 1600° C. at a rate of 10° C./min. And then, as a pre-growth process at the same time as decompression, the temperature is raised at a rate of 3° C./min, and the temperature of the lower portion of the internal space was set to 2350° C., which is the temperature of the maximum heating region of the heater. Thereafter, while maintaining the same conditions, the silicon carbide ingot was grown under the conditions of the moving speed, moving time, and moving distance of the heater in Table 1.

After the growth, the temperature of the internal space was cooled to 25° C. at a rate of 5° C./min, at the same time, argon gas was injected so that the pressure in the internal space became 760 torr. Then, the formed silicon carbide ingot was cut and separated from the seed crystal.

Comparative Example—Changing the Moving Speed of Heater

In the above embodiment, except for changing the moving speed, moving time, and moving distance of the heater to the conditions shown in Table 1, it proceeded in the same manner as in the above embodiment.

Experimental Example—Measurement of the Height, Height Difference and the Presence of Cracks of the Manufactured Silicon Carbide Ingot In the front region of silicon carbide ingots prepared in each of the examples and comparative examples, the central height of the front region of the growth end was measured with a height gauge, the height of the outer shell of the silicon carbide ingots was measured, and the presence of cracks in the seed crystal surface, which is the cut surface of the ingot, was identified with the naked eye and shown in FIG. 1.

Experimental Example—Measurement of Wafer Defect Density

The silicon carbide ingots prepared in each of the examples and comparative examples were cut to have an off-angle of 4 and a seed crystal surface as a cut surface, and wafer samples having a thickness of 360 were prepared.

The wafer samples were cut to have a size of 50 mm×50 mm in a region having an outer diameter of 95% with respect to the maximum outer diameter of the prepared wafer samples and etched by dipping it in molten potassium hydroxide (KOH) at 500° C. for 5 minutes. Then, the defects on the surface were photographed through an optical microscope, etc. The clamshell-like pit was classified as a basal surface dislocation (BPD), and the black giant hexagonal pierced pit was classified as a micropipe (MP).

An area of 500×500 μm in the cut wafer sample was randomly designated 12 times. The number of defects in each area was measured, the average number of defects per unit area, and the defect density were calculated. Then, the results are shown in Table 1.

TABLE 1

| | Example 1 | Example 2 | Example 3 | Example 4 | Comparative Example 1 | Comparative Example 2 | Comparative Example 3 |
|---|---|---|---|---|---|---|---|
| Moving speed of heater (mm/hr) | 0.16 | 0.2 | 0.15 | 0.3 | 0 | 0.5 | 0.51 |
| Moving time of heater (hr) | 80 | 100 | 75 | 100 | 0 | 100 | 102 |
| Moving distance of heater (mm) | 16 | 20 | 15 | 30 | 0 | 50 | 51 |
| Height of manufactured ingot (mm) | 25.7 | 23.2 | 24.3 | 21.6 | 7.4 | 10.1 | 9.7 |
| Difference in height of manufactured ingot* (mm) | 2.9 | 2.5 | 2.6 | 2.1 | 4.3 | −0.17 | −0.22 |
| MP Density (/cm$^2$) | 0.2 | 0.29 | 0.27 | 0.59 | 1.37 | 1.85 | 1.99 |
| BPD Density (/cm$^2$) | 860 | 980 | 960 | 930 | 1510 | 1780 | 1830 |
| EPD (/cm$^2$) | 6800 | 7000 | 6700 | 8300 | 7500 | 12200 | 14900 |
| Presence of crack | X | X | X | X | ○ | X | X |

Difference in Height of Ingot*: The difference between the height of the center of the front region, which is the opposite side from the rear region of the ingot, and the height of the edge of the front region.
MP*: Micropipe
BPD*: Basal Plane Dislocation
EPD*: Etch Pit Density Referring to Table 1, in the case of the examples in which the moving speed of the heater is 0.1 mm/hr to 0.48 mm/hr, the center height of the front region surface opposite to the rear region (the seed crystal surface) of the ingot was 20 mm or more. It was confirmed that the difference between the center height and the edge height was 2 mm to 3 mm, and the defect density value of the wafer manufactured from the ingot was also favorable.

The comparative examples in which the heater do not move or move at a rate of 0.5 mm/hr, the center height was 11 mm or less. In comparative example 1, cracks occurred on the rear region (the seed crystal surface) of the ingot, and the defect density value of the wafer manufactured from the ingot was relatively high.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a silicon carbide ingot, the method comprising:
   a preparing operation of adjusting an internal space of a reactor in which silicon carbide raw materials and a seed crystal are disposed in a lower part and an upper part of the internal space, respectively, to have a vacuum atmosphere;
   a proceeding operation of injecting an inert gas into the internal space, heating the internal space by moving a heater surrounding the reactor to induce the silicon carbide raw materials to sublimate, and growing the silicon carbide ingot on the seed crystal; and
   a cooling operation of cooling a temperature of the internal space to a room temperature,
   wherein the moving of the heater has a relative position which becomes more distant at a rate of 0.1 mm/hr to 0.48 mm/hr based on the seed crystal,
   wherein the proceeding operation sequentially comprises a pre-growth process and a growth process,
   wherein the pre-growth process sequentially comprises a first process, a second process, and a third process,
   wherein:
      the first process in the pre-growth process is to change the vacuum atmosphere to an inert atmosphere and maintain a temperature difference of 40° C. to 60° C. between the upper part near the seed crystal and the lower part near the silicon carbide raw materials,
      the second process in the pre-growth process is to raise the temperature of the internal space using the heater, and
      the third process in the pre-growth process is to depressurize the internal space to reach a growth pressure and heat the internal space to a growth temperature of 2100° C. to 2500° C.,
   wherein the growth process maintains the internal space at the growth temperature and the growth pressure and induces the silicon carbide ingot to grow,
   wherein the heater is moved during the growth process,
   wherein a maximum heating region of the internal space corresponds to a position at a center of the heater, and the maximum heating region has a temperature of 2100° C. to 2500° C.

2. The method of claim 1, wherein the internal space has a sub-heating region with a temperature 110° C. to 160° C. lower than the temperature of the maximum heating region, and the heater is movable to maintain the temperature of the sub-heating region.

3. The method of claim 1, wherein a total moving distance of the heater is 10 mm or more.

4. The method of claim 1, wherein a temperature difference between the upper part of the internal space and the lower part of the internal space in the growth process is greater than the temperature difference in the first process by 70 to 120° C.

* * * * *